United States Patent [19]

Wakeman

[11] Patent Number: 4,501,020
[45] Date of Patent: Feb. 19, 1985

[54] SPECTRUM SURVEILLANCE RECEIVER SYSTEM

[75] Inventor: Philip E. D. Wakeman, Nepean, Canada

[73] Assignee: Her Majesty in Right of Canada, Canada

[21] Appl. No.: 420,894

[22] Filed: Sep. 21, 1982

[51] Int. Cl.³ .............................................. H04B 17/00
[52] U.S. Cl. .................................... 455/226; 455/165; 455/67; 375/10
[58] Field of Search ................ 455/67, 115, 165, 226; 375/10; 324/77 B, 77 C, 77 CS; 364/485

[56] References Cited

U.S. PATENT DOCUMENTS

| | | | |
|---|---|---|---|
| 3,736,510 | 5/1973 | Wu | 455/115 |
| 3,771,059 | 11/1973 | Butler et al. | 455/67 |
| 4,166,980 | 9/1979 | Apostolos et al. | 455/226 |
| 4,227,255 | 10/1980 | Carrick et al. | 455/226 |
| 4,270,217 | 5/1981 | Baker | 455/165 |

OTHER PUBLICATIONS

"Modulation Analyzer FAM for 55 kHz Through 1.36 GHZ" by Burkhart et al., 1980.

IEE Symposium Paper Entitled "Microprocessor Control Structure"; Apr. 16–18, 1980.
"Ceres–a Computer-Aided Radio Monitoring and Surveillance System"; S. Faulkner, International Defense Review 3/1977, pp. 503–506.

Primary Examiner—Jin F. Ng
Attorney, Agent, or Firm—Hayes Davis & Soloway

[57] ABSTRACT

A method and an apparatus for surveilling RF signals, the apparatus comprising a receiver for receiving RF signals at a selectively variable reception frequency and converting any signal received at that frequency to a predetermined IF signal, a sampling circuit for sampling the IF signal and providing output signals representative of a plurality of predetermined properties of the received signal; a circuit for comparing the representative output signals against a plurality of sets of reference signals each of which is representative of a particular modulation type and providing a first output indicative of the type of modulation of the received signal when the representative signals substantially match the set of reference values of one of the modulation types and a second output indicative of an unidentified received signal when the representative signals do not match any of the sets of reference signals.

13 Claims, 15 Drawing Figures

SPECTRUM SURVEILLANCE RECEIVER SYSTEM

The present invention generally relates to a method and apparatus for identifying unkown signals in the radio communication spectrum and, more specifically, to a method and an apparatus for identifying the type of modulation and actual frequency of such signals.

Devices of the aforementioned type are primarily required for monitoring RF channel usage and detecting unauthorized users and in electronic warfare applications for identifying signals transmitted by unfriendly forces. Heretofore, the determination of radio frequency modulation characteristics for surveillance purposes has been accomplished by time consuming and tedious manual processes utilizing spectrum analyzers and/or oscilloscopes and other receiving equipment operated by highly skilled and experienced operators. The present invention seeks to provide a method and an apparatus which overcomes the drawbacks of conventional methods and apparatuses and, in particular, provide a system whereby at least a predetermined band of the radio frequency spectrum is automatically and rapidly scanned and signals exceeding appropriate amplitude levels identified as to type of modulation and actual frequency, and can be operated by relatively unskilled and untrained operators.

In accordance with one aspect of the method of the present invention, signals within a predetermined RF band are identified as to the type of modulation by receiving the signals at a reception frequency within the RF band and converting any signal received at the frequency to an IF signal having a predetermined IF, sampling the envelope of the IF signal, determining the mean, the variance and the percentage of the samples which have a predetermined amplitude and, comparing each of the determined signals against a predetermined set of reference signals, each set being distinctive of a particular modulation type. The type of modulation is determined when the determined signals match one of the set of reference signals.

In accordance with another aspect of the present invention, the RF signal received at a particular reception frequency, having been converted to the predetermined final IF frequency, is then fed to a number of phase-locked loops. The loop outputs are sampled at a predetermined sampling frequency to determine their tendency to lock to the IF signal, and if being locked, if the loop outputs indicate signal modulation. The results of the sampling are accumulated, and determination made of the percentage of the samples which indicate lock and the percentage of the samples which indicate modulation. Comparison of the percentage of the samples which were locked and modulated for each phase-locked loop is made against predetermined sets of reference values each of which is distinctive of a particular type of modulation. The type of modulation is identified when the measured percentages match one of the predetermined sets of reference values.

In accordance with one aspect of the apparatus of the present invention, there is provided a spectrum surveillance apparatus for surveilling signals within a predetermined RF band and identifying the type of modulation of signals within the band. The apparatus comprises a receiver adapted to receive RF signals at a variable reception frequency within the RF band and convert the RF signals to IF signals having a predetermined IF, means for sampling the envelope of the IF signal, means responsive to the sampling means for providing signals representative of at least the mean, the variance and the percentage of the samples which have at least one particular, predetermined amplitude and means for comparing the representative signals against predetermined sets of reference signals, each set being distinctive of particular modulation type, and providing a first output indicative of the type of modulation of the signal when the representative signals substantially match the set of reference values for that modulation type or a second output when the representative signals do not match any of the sets of reference values.

In accordance with another aspect of the apparatus of the present invention, the sampling means samples the IF signal and provides AM, FM and DSB lock indication outputs, modulation indication outputs and offset frequency outputs. Means is provided for accumulating the lock and modulation indication outputs and provide output signals representative of the percentage of the samples which were locked and modulated. A comparator means compares the output signals against predetermined sets of reference values, each set being distinctive of a particular modulation type, and provides a first output indicative of the type of modulation of the signal when the representative signals substantially match the sets of reference values for that modulation type and a second signal indicative of an unidentified signal when the representative signals do not match any of the reference values. Means responsive to the comparator means is provided for selecting the appropriate one of the sampling means offset frequency outputs and providing an identified signal actual frequency output.

These and other features of the invention will become more apparent from the following description in which reference is made to the appended drawings, wherein.

Figure 1:
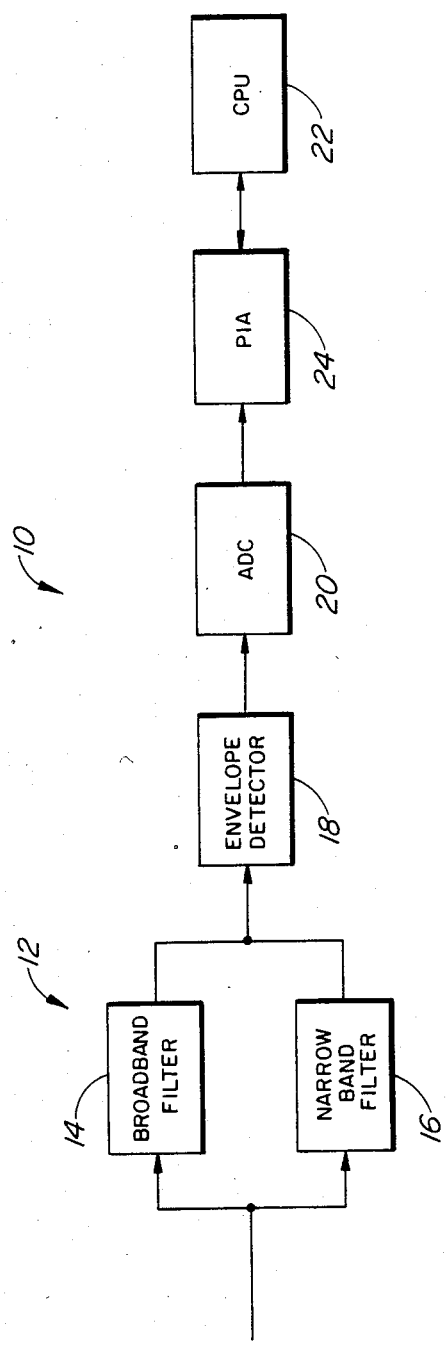
FIG. 1 is a block diagram illustration of one aspect of the apparatus of the present invention.

The following description initially describes the methods by which the present invention identifies signals in the radio frequency spectrum and, in particular, identifies the type of modulation and frequency of RF signals. The discussion includes a general description of the major components of apparatus for carrying out the method. This general discussion is followed by a description of a preferred mode of carrying out the invention.

The present invention is particularly concerned with AM, FM, DSB, SSB, CW and PSK types of modulation. It is to be understood at the outset, however, that the invention is not limited to these types of modulation but, rather, that the invention is equally applicable to other types of signal modulation.

Generally, the signal identification process of the present invention is based on the notion that different signals possess distinctive characteristics which can be measured. Thus, the method of the present invention involves detecting certain predetermined characteristics of the signal and comparing the detected characteristics with predetermined threshold values, or reference values which are known to be distinctive of known modulation types of interest.

More specifically, the present invention contemplates three signal identification processes, namely, an amplitude probability distribution (APD) process, a phase-locked loop (PLL) process and a process comprised of the combination of the APD and PLL processes. The APD and PLL processes each have particular advantages over the other, as will become clearer later, while the third process takes advantage of the major benefits of the first two processes.

In the APD method, the IF envelope of the unknown signal is sampled at an appropriate sampling frequency and the samples are accumulated or stored in accordance with their magnitudes. Following sampling, the mean, the variance and $P(x)$ are determined. A sample, $x$, is, in this instance, the measurement of the amplitude of the IF envelope of the unknown signal. The mean and the variance are defined as follows:

mean $= (\epsilon x)/N$ variance $= 1/N(\epsilon(x^2) - 1/N(\epsilon x)^2)$ where N is the number of samples taken.

$P(x)$ is defined as the probability of the IF envelope having a particular sample x. Stated differently, $P(x)$ is the percentage of the total number of samples which have a particular amplitude x. Thus, $P(0)$ is the percentage of the samples which have zero magnitude.

The determined values of the mean, variance and one or more $P(x)$ are compared with each of a plurality of sets of reference values which have been predetermined to be distinctive of particular types of modulation of interest. The reference values can readily be determined experimentally by passing signals of known modulation through an appropriate apparatus and determining average values for the mean, variance and one or more $P(x)$ for each type of modulation. Examples of reference values are given later. When the determined values of the mean, variance and one or more $P(x)$ substantially match the reference values of one of the sets of reference values, the type of modulation of signal has been identified.

Preferably, the comparison step involves two stages of comparison. In the first stage, the determined values of the mean, variance and one or more $P(x)$ are compared with a set of threshold reference values so as to obtain logical representative values. The second comparison stage involves comparing the logical representative values against a plurality of sets of logical reference values each of which is distinctive of a particular modulation type.

It has been found that the characteristics of certain signals may vary with the bandwidth of the filters through which the IF signal is passed. For example, FM, PSK and CW signals display similar characteristics when passed through a filter having a relatively broad bandwidth, such as 24 kHz, so that at this bandwidth it is difficult to distinguish between the three types of signals. However, FM and PSK signals display distinctly different characteristics when passed through a filter having a relatively narrow bandwidth such as 6 kHz. The characteristics of AM, DSB, SSB and CW signals remain substantially the same at both bandwidths.

Accordingly, in the event that the first identification attempt fails to positively identify the type of modulation of the unknown signal, the sampling and comparison process is repeated at a different bandwidth. If the signal is still not identified following the second identification attempt, it is presumed to have been modulated by a modulation process for which the apparatus is not arranged to identify.

FIG. 1 illustrates, in block diagram format, an apparatus 10 for carrying out the APD method. After conversion to an IF signal of 455 kHz, the unknown signal is passed through filter means 12. Filter means 12 includes at least one broadband filter 14 (24 kHz) and one narrowband filter 16 (6 kHz). Additional filters may be provided if so desired. The IF signal is initially passed through the broadband filter 14. The signal is then demodulated by an envelope detector 18 and is fed to analog-to-digital converter (ADC) 20 which samples the IF envelope output of detector 18 at a predetermined sampling frequency. A computer 22 reads the output of ADC 20 via a peripheral interface adapter (PIA) 24 and accumulates the data in appropriate accumulators during sampling. Once a predetermined number of samples have been taken, the number of samples being under the control of the operator, the computer calculates the mean, variance and one or more $P(x)$ and carries out the two aforementioned comparison steps. If the comparison indicates a match between the determined values and the reference values, the type of modulation is displayed on an appropriate device. If the signal is unidentified after the first attempt, the IF signal is passed through narrowband filter 16 and the process is repeated.

ADC 16 may be an 8-bit converter which would provide 0.4% (1/256) resolution on the IF envelope. Such resolution is deemed to be quite adequate for the purposes of the present invention. In theory, the sampling frequency should be at least twice the frequency of the unknown signal in order to properly represent the envelope amplitude shape. However, it has been determined that provided that the acquisition time is short and the number of samples obtained is relatively high, the amplitude distribution can be obtained at sampling frequencies which are less than the theoretical. As previously suggested, the computer may be provided with 256 counters (not shown), one corresponding to every possible output of ADC 20. Thus, for every output of the ADC, the appropriate counter is incremented by 1. At the end of sampling, all of the counters are divided by the number of samples taken and this provides the $P(x)$'s. However, it will be understood that only those counters which correspond to the desired P(x) need be so divided.

In order to provide good statistical significance, the computer should read a minumum of 256 samples. It will be understood, however, that the computer can be programmed to provide a much larger number of samples in response to an appropriate operator input.

The phase-locked loop signal identification process is based on the principle that signals of different modulation types will lock onto different phase lock loops when passed through one or more different phase-locked loops. Thus, in accordance with this method, the IF signal is passed through each of three phase-locked loops, including an AM loop, an FM loop and a DSB loop, with each loop having a lock indication output and a modulation indication output. The two outputs of each of the three phase-locked loops are sampled at a predetermined sampling frequency and the samples are stored during the sampling process.

The outputs of the phase-locked loops will be logical outputs, that is, either a "1" indicating that the signal was either locked or modulated or a "0" indicating that the signal was not locked or modulated. Accordingly, the outputs of the phase-locked loops may be readily read by a computer via a peripheral interface adapter.

Since the unknown signals are non-stationary, such as voice modulated signals, the phase-locked loops can only lock onto and detect the modulation of the signals up to a certain percentage of the time. Accordingly, it is necessary to obtain a statistical average of the phase-locked loop outputs over a period of time in order to determine the locking and modulating properties of the signals. This is readily achieved by dividing the content of the accumulators for each output by the total number of samples taken.

Table I illustrates the expected outputs from AM, FM and DSB phase-locked loops in response to AM, FM, PSK, CW, DSB and SSB modulated signals. The "1" indicates a lock or modulation condition, the "0" indicates a no lock or no modulation condition and the "x" can indicate either condition depending upon the particular signal. Thus, the "x" is not instrumental in signal identification. It will be seen that the AM loop and DSB loop are expected to detect the modulation (M) of an AM signal and that the AM loop, FM loop and DSB loop are expected to indicate a lock condition (L) for an AM signal. On the other hand, the FM loop is not expected to detect the modulation of an AM signal. Since each of the six sets of values are different, it will be seen that this method can also readily distinguish between and identify the six different types of signals.

After the aforementioned sampling, accumulation and statistical information determination steps, the phase-locked loop signal identification process undergoes two stages of comparison. In the first stage of comparison, the determined percentage values are compared against a predetermined set of threshold values so as to obtain logical signal representative values (Table II sets forth appropriate threshold values). That is, the result of this comparison is a logical "1" or a logical "0" for each output of the three phase-locked loops. The second stage of comparison then involves comparing the output obtained from the first stage of comparison with each of the six logical reference values delineated in Table 1. When the output of the first comparison test substantially matches one of the six sets of logical reference values of Table I, the type of modulation of the signal has been identified.

If the first signal identification attempt fails to reveal the type of modulation of the unknown signal, the process may be repeated but modified to take a larger number of samples.

An advantage of the phase-locked loop signal identification process is that it is capable of accurately determining the actual frequency of the unknown signal as will be explained hereinafter.

Figure 2:
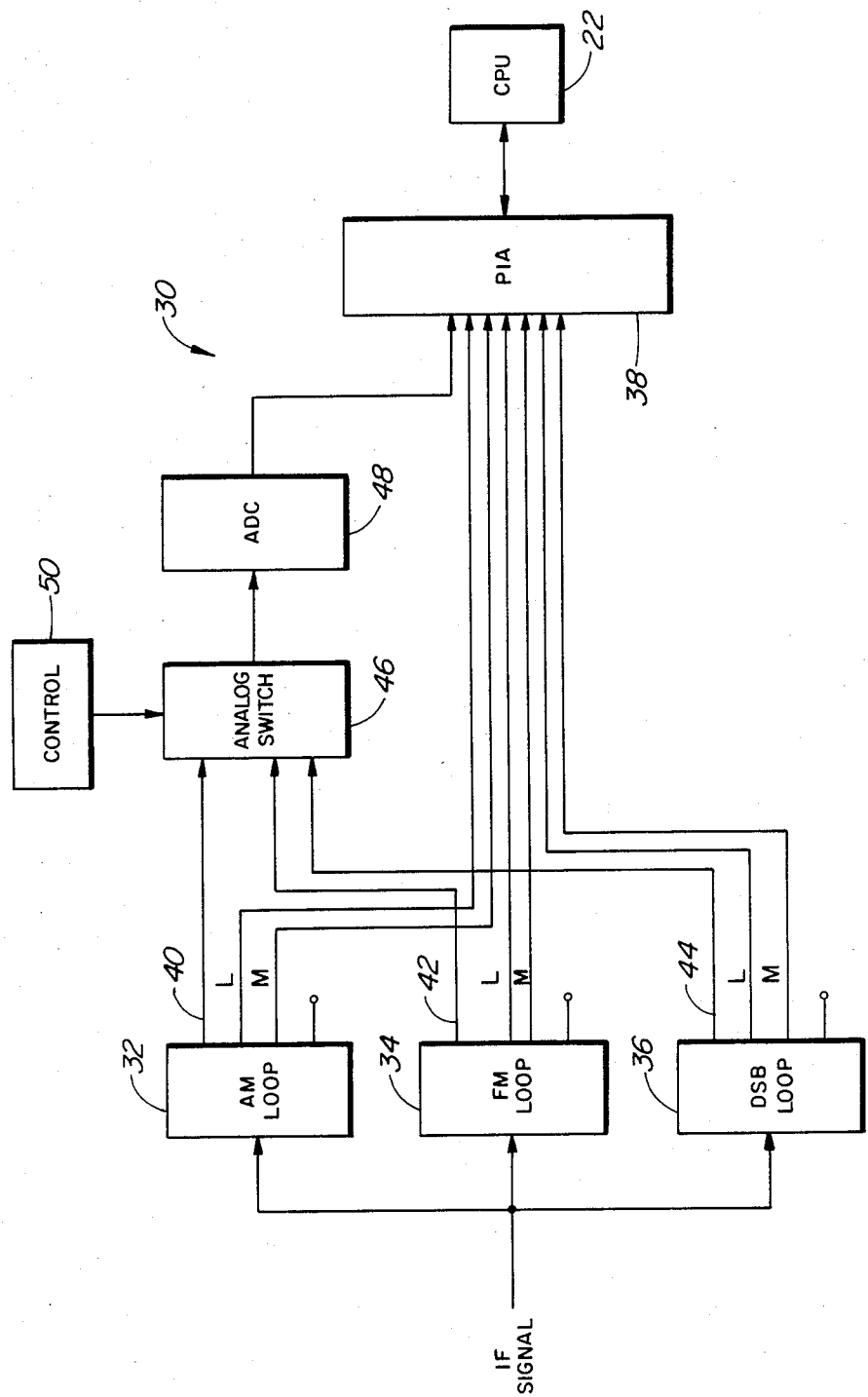
FIG. 2 is a block diagram illustration of a second aspect of the apparatus of the present invention.

With reference to FIG. 2, the phase-locked loop signal identification unit 30 is comprised of an AM phase-locked loop 32, an FM phase-locked loop 34 and a DSB phase-locked loop 36. Each phase-locked loop has a lock indication output L and a modulation indication output M which are connected to a computer 22 via a PIA 38. The phase-locked loops also include offset frequency outputs 40, 42, 44, respectively, connected to an analog switch 46 the output of which is connected to an analog-to-digital converter 48. ADC 48 is connected to computer 22 via PIA 38. A control 50 is provided to select the appropriate one of the phase-locked loop offset frequency outputs for determining the actual frequency of the unknown signal.

Each phase-locked loop may also be provided with a fourth output, a demodulated signal output, for measuring the modulation index of the signal if so desired.

Thus, after conversion to an IF signal, the unknown signal is fed to each of the phase-locked loops. The lock indication and modulation indication outputs of each phase-locked loop is sampled at a predetermined sampling frequency and the results are accumulated in the computer 22 as previously mentioned. At the end of sampling, the contents of the accumulators are divided by the total number of samples taken and this provides a statistical average of locking and modulation of the signal over a period of time. These fractional values indicate the percentage of lock and modulation which are then compared by the computer with reference values to determine the type of modulation of the unknown signal, as previously mentioned. As with the APD method, the computer should read a minimum of 256 samples but a much larger number of samples may be taken at the discretion of the operator.

Once the type of modulation of the unknown signal has been determined, control 50 actuates analog switch 46 so as to select the appropriate one of its three inputs 40, 42 and 44 from loops 32, 34 and 36 respectively. ADC 48 digitizes the output of switch 46 and feeds it to the computer which converts the digitized signal to a frequency value and adds the frequency value to the frequency of reception of the receiver. The offset frequency output of the phase-locked loops are DC signals which are directly or linearly related to the frequency. Accordingly, the conversion step is straightforward and readily effected.

As previously mentioned, both of the above-described methods can be used separately or individually and still correctly identify the type of modulation of the unknown signal. However, each has certain advantages over the other. For example, the APD hardware is much simpler than the PLL hardware in the sense that it requires only one IF detector before the signal is digitized and input into the computer. The PLL hardware, on the other hand, requires six detectors. Thus, the APD hardware tends to be simpler than that of the PLL hardware. Nevertheless, the PLL method can readily provide the offset frequency measurement and, therefore, can accurately identify the actual frequency of the unknown signal. This permits more accurate tuning and enhancing of signal quality. There is merit, therefore, in providing a signal identification process comprised of the combination of the two methods. This combination will now be described.

In the combined APD and PLL signal identification process, any appropriate number of measurements taken with respect to each of the APD and PLL signal identification processes may be taken. In the specific apparatus described hereinafter, the signal identification unit is arranged to measure the amplitude of the IF envelope of the unknown signal and determine the variance and P(0) in accordance with the APD method and detect the AM, FM and DSB locking and modulating properties of the unknown signal in accordance with the PLL method. This provides a total of eight characteristics which are deemed quite adequate for identifying the six types of modulation. It is to be understood that a different number and/or combination of characteristics of the unknown signal may be detected without departing from the spirit of the present invention. In addition to detecting the type of modulation of the unknown signal, the combined signal identification process is capable of determining the actual frequency of the unknown signal.

The RF signal is initially converted to an IF signal having a IF of 455 kHz. The signal is then passed through a broadband filter having a bandwidth of about 24 kHz. The signal is then directed to an APD circuit such as previously mentioned circuit 10 and a phase-locked loop circuit such as aforementioned circuit 30. The circuits process the data in precisely the same manner as the two aforementioned methods. In the event that the first signal identification attempt fails to identify the type of modulation of the signal, the signal is passed through a narrow band IF filter having a bandwidth of about 6 kHz and the process is repeated. The process may also be modified, at the discretion of the operator, so as to obtain a much larger number of samples if signal identification proves difficult.

As with the previous methods, the combined process provides two levels of comparison. The first level of comparison compares the contents of the accumulators with a first set of threshold reference values so as to obtain a logical output for each characteristic of the unknown signal. The second level of comparison compares the logical output of the first level of comparison against a plurality of sets of logical reference values each of which is indicative of the type of modulation of the unknown signal.

Table II sets out representative threshold reference values used in conjunction with the first level of comparison and provides a threshold level for each of the eight characteristics in question. The PLL reference values represent the expected percentages of locking and modulation by the AM, FM and DSB loops. The APD threshold reference values represent threshold variance and P(0). Each of the characteristics is compared against its respective threshold reference value and is allocated a logical "1" if it exceeds its respective threshold reference value and a logical "0" when it is less than its respective threshold reference value.

Table III sets out six sets of logical reference values used in the second level of comparison, each set being distinctive or different from every other set and representative of the particular type of signal modulation indicated. The set of eight logical outputs of the first level of comparison is compared against each of the six sets of logical reference values of Table III. The signal modulation type of the unknown signal is identified when there is an exact match between the logical output of the first level of comparison and any one of the six sets of logical reference values of the second level of comparison. It will be noted that certain values indicated by an "x" in Table III are not critical and, accordingly, these are not significant in the signal identification process. The content of Tables II and III can be readily stored in a look-up table in computer memory.

Once the type of modulation of the signal has been identified, the signal frequency is determined in the manner described with respect to the phase-locked loop method.

Figure 3:
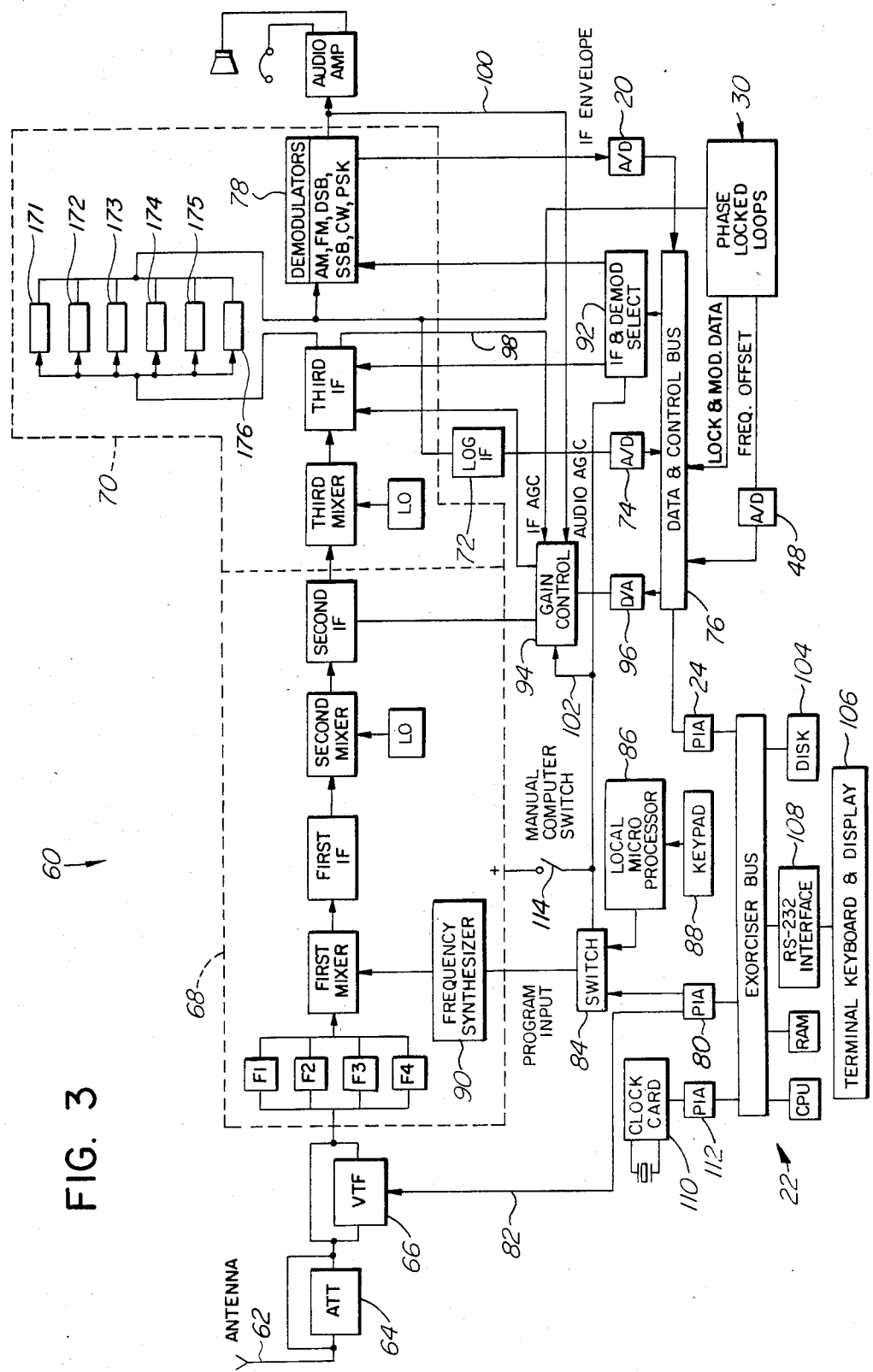
FIG. 3 is a block diagram illustration of an automated form of the apparatus of the present invention.
Figure 4:
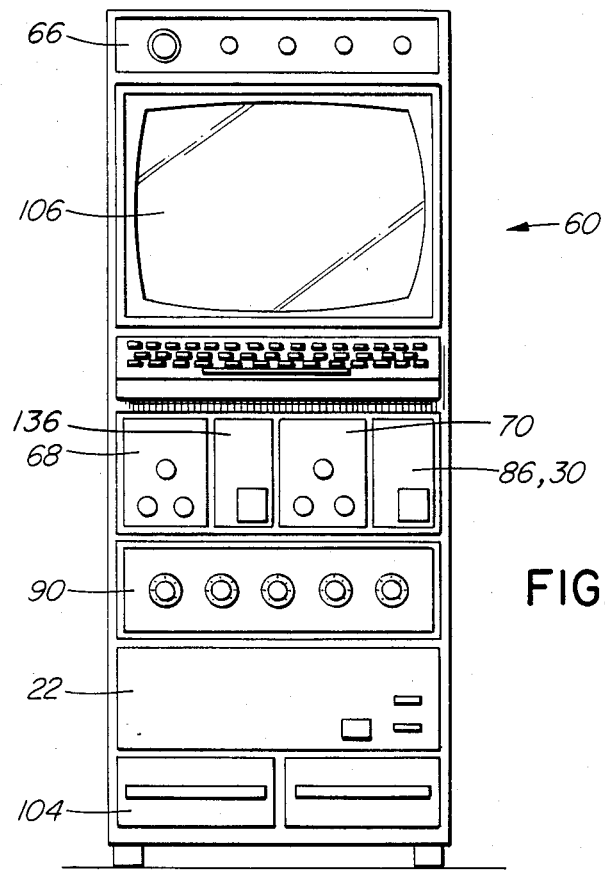
FIG. 4 is a front elevational view of the apparatus diagrammatically illustrated in FIG. 3.

FIG. 3 diagrammatically illustrates a preferred form of the automated signal identification system 60 of the present invention while FIG. 4 illustrates a front panel of the apparatus and its major components.

The output of an antenna 62 is connected to an attenuator 64, which can be selectively bypassed at the discretion of the operator, for use in signal identification in strong RF environments. The output of the attenuator 64 is connected to an RF filter preselector module 66, which can also be selectively bypassed at the discretion of the operator, for narrowing the bandwidth of reception to a desired frequency so that the receiver front end circuits realize reduced distortion from interfacing inter-modulation products and harmonics.

The signal is then fed to an RF receiver 68 which converts the RF signal to a first IF of either 122 or 70 MHz and then to a second IF of 10.7 MHz. As will be explained in greater detail later, the frequency of reception of the receiver can be controlled by an operator or by computer. The 10.7 MHz signal is fed to an IF module 70 whereat the signal is down converted to a third IF of 455 kHz. The IF module includes six switched IF filters having different bandwidths for use in a manner which will be described in greater detail later.

The apparatus is arranged to compare the amplitude of the output of IF module 70 with a predetermined threshold level and either stop the signal scanning process or increment the frequency of reception if the amplitude is less than the threshold. If the signal exceeds the amplitude threshold level predetermined by the operator, the signal is directed to signal identification circuits. The amplitude detecting means includes a log IF circuit 72 and an ADC 74 which digitizes the output of log IF 72 and feeds it to a data and control bus 76 connected to a computer via a PIA 24.

Signals exceeding the predetermined amplitude threshold level are directed to demodulator circuit 78 and phase-locked loop circuits 30. Demodulator circuit 78 includes an AM detector which supplies an IF envelope signal to ADC 20 connected to the data and control bus 76. Thus, the AM demodulator or detector and ADC 20 together constitute the APD detection hardware. The lock indication and modulation indication outputs of phase-locked loops 30 are fed to the computer via data and control bus 76 and PIA 24. Additionally, an offset frequency signal is directed to the data and control bus 76 via ADC 48.

Under software control, the computer is arranged to carry out several functions. Firstly, the computer is programmed to switch in or out preselector 66 depending upon the reception frequency of receiver 68 and, if switched in, select the appropriate filter as will be explained later. This function is accomplished by a signal directed to preselector switches via PIA 80 and line 82. Secondly, the computer is programmed to automatically increment the frequency of reception of the receiver via PIA 80 and a switch 84, a local microprocessor 86 and keypad 88 being provided for determining the appropriate mixing frequency of a frequency synthesizer 90. While not shown in FIG. 3, the computer is also arranged to select one of four RF filters to be described later so as to narrow the bandwidth of reception. Thirdly, the computer is arranged to select one of six IF filters in the IF module 70 and an appropriate demodulator in demodulator circuit 78 via an IF and demodulator select circuit 92. Fourthly, the computer is arranged to provide appropriate signals to a gain control circuit 94 via a DAC 96. The gain control circuit 94 receives an IF automatic gain control signal along line 98 and an audio automatic gain control signal along line 100 and a manual gain control signal along line 102. In addition to the aforementioned control functions, the computer is arranged to store on disc 104 a trace or traces of signals passed through the system for display on a CRT display 106 via an interface 108. Operator inputs are provided via a terminal keyboard which, in FIG. 3, is shown as being part of display block 106. A clock card 110 provides time signals to the computer via PIA 112.

Figure 5:
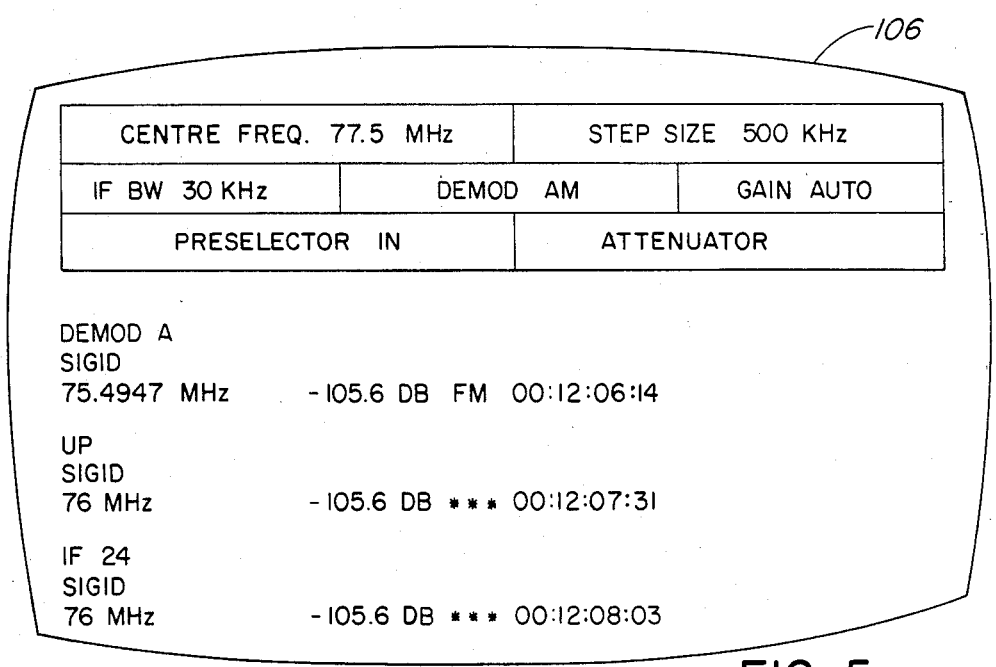
FIG. 5 is a view illustrating the display for the automated apparatus illustrated in FIG. 3 when operated in a manual mode.

The system is designed to operate in a manual mode and in an automatic scanning mode determined by a switch 114. The operation of the apparatus in these two modes may be best understood by reference to FIGS. 5 and 6 which are the displays on the CRT 106 in the manual and automatic scanning modes, respectively.

The term "manual" is not to be confused with the prior art manual signal identification process. In the context of the present invention, the manual mode simply transfers control of the major components of the apparatus from the computer to the operator. However, the signal identification process is carried out as quickly and readily in the manual mode as it is in the automatic scanning mode.

In the manual mode, the operator inputs, via terminal keyboard 106, the reception frequency or centre frequency, the step size of scanning, selects the appropriate one of six filters in IF module 70, the appropriate one of the AM, FM, DSB, SSB, CW or PSK demodulators in demodulator circuit 78, the type of gain, and switches the attenuator and preselector in or out. The operator may also input the number of samples which are to be taken and the amplitude threshold level beyond which signal identification is to take place.

Under these conditions, the apparatus displays on the CRT the centre frequency, the amplitude level, the type of modulation and the time of detection of the signal. The asterisks represent unidentified signals. The operator is also able to control whether the signal undergoes signal identification.

Figure 6:
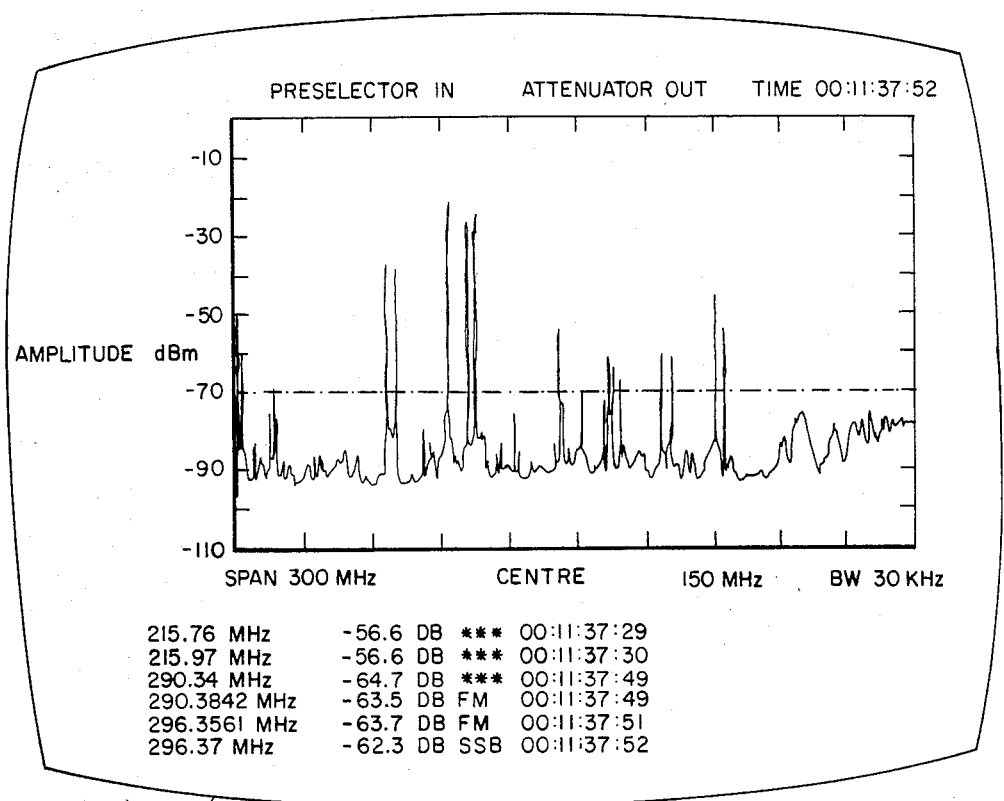
FIG. 6 is similar to FIG. 5 but illustrates the display of the apparatus when operated in an automatic scanning mode.

In the automatic scanning mode, the system is arranged to automatically scan a predetermined bandwidth within the bandwidth of reception of the system which, in the illustrated embodiment, is 1–300 MHz, once the operator has input the appropriate parameters via terminal keyboard 106. As shown in FIG. 6, these parameters include the centre frequency or frequency of reception, the scan width, the amplitude threshold level, the number of samples, preselector and attenuator in or out and the step size of the scan. At each step, the apparatus compares the output of the IF module with the amplitude threshold level and attempts to identify any signal which exceeds the amplitude threshold level, which in the display illustrated in FIG. 6 is $-70$ dB. If the signal is less than the amplitude threshold level, the frequency of reception is incremented by the step size predetermined by the operator and a fresh signal is analyzed.

In addition to displaying the trace on the CRT, the system displays, for identified signals, the actual frequency of identified signals, the amplitude level, the type of modulation and the time at which the particular signal was received.

After each scan and incrementation of the centre frequency, the appropriate filter in preselector 66 and the appropriate filter in receiver 68 are selected as well as the appropriate IF filter in IF module 70. The gain control circuit 94 is utilized during the amplitude comparison process. The apparatus circuitry will now be described in greater detail.

Figure 7:
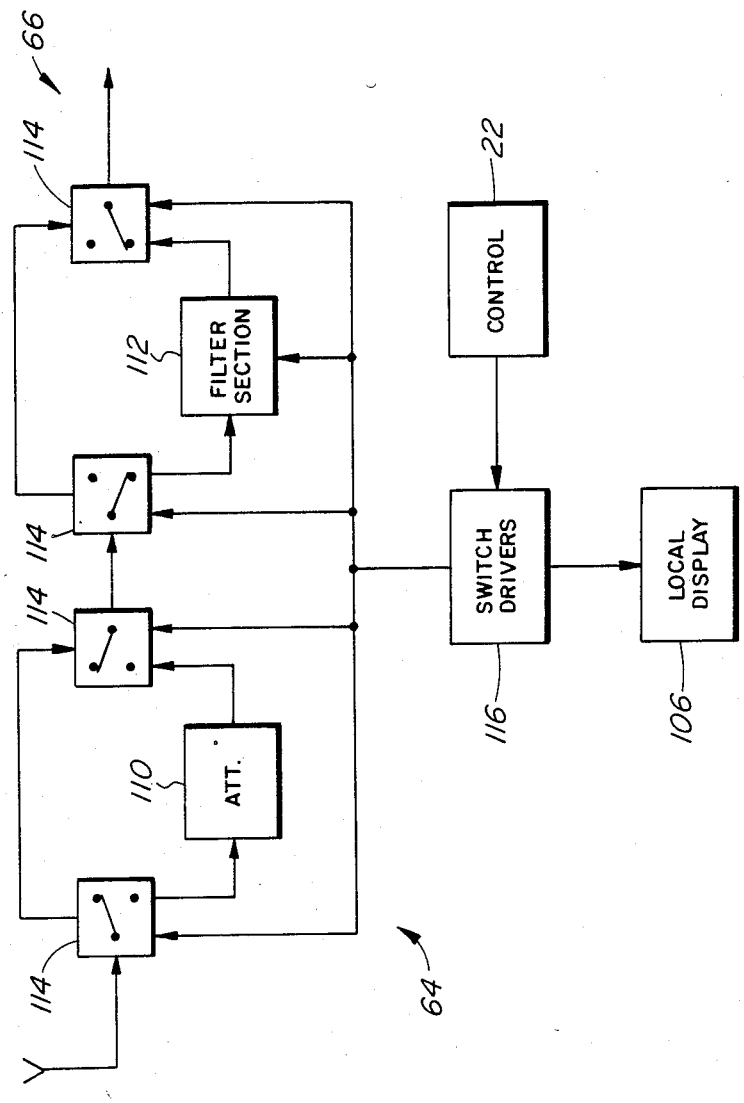
FIG. 7 is a block diagram illustrating an attenuator and filter preselector section.

FIG. 7 diagrammatically illustrates the attenuator section 64 and preselector section 66. The attenuator section includes a 10 dB attenuator 110 which precedes the preselector section, and is used in strong RF environments. Both sections include switches 114 permitting bypassing of one or both sections. Under the control of the computer, signals in the range of 20 to 140 MHz are passed through the preselector filter section 112 while signals in the range of 1–19 and 141–300 MHz are bypassed from the filter. The filter elements may be of any desired form. However, a combination of six capacitors and two inductors (not shown) provide 47 filter combinations each having a bandwidth of about 10 MHz in the 20-140 MHz range. The specific capacitor-/inductor combinations for a particular frequency range are predetermined and stored in a look-up table in the computer memory. As the receiver is swept through a range, or if the operator manually selects a particular centre frequency, the computer determines and sends the appropriate logic levels to the preselector switch drivers 116 via PIA 80. As previously mentioned, the state of the preselector module may be displayed on CRT.

Figure 8:
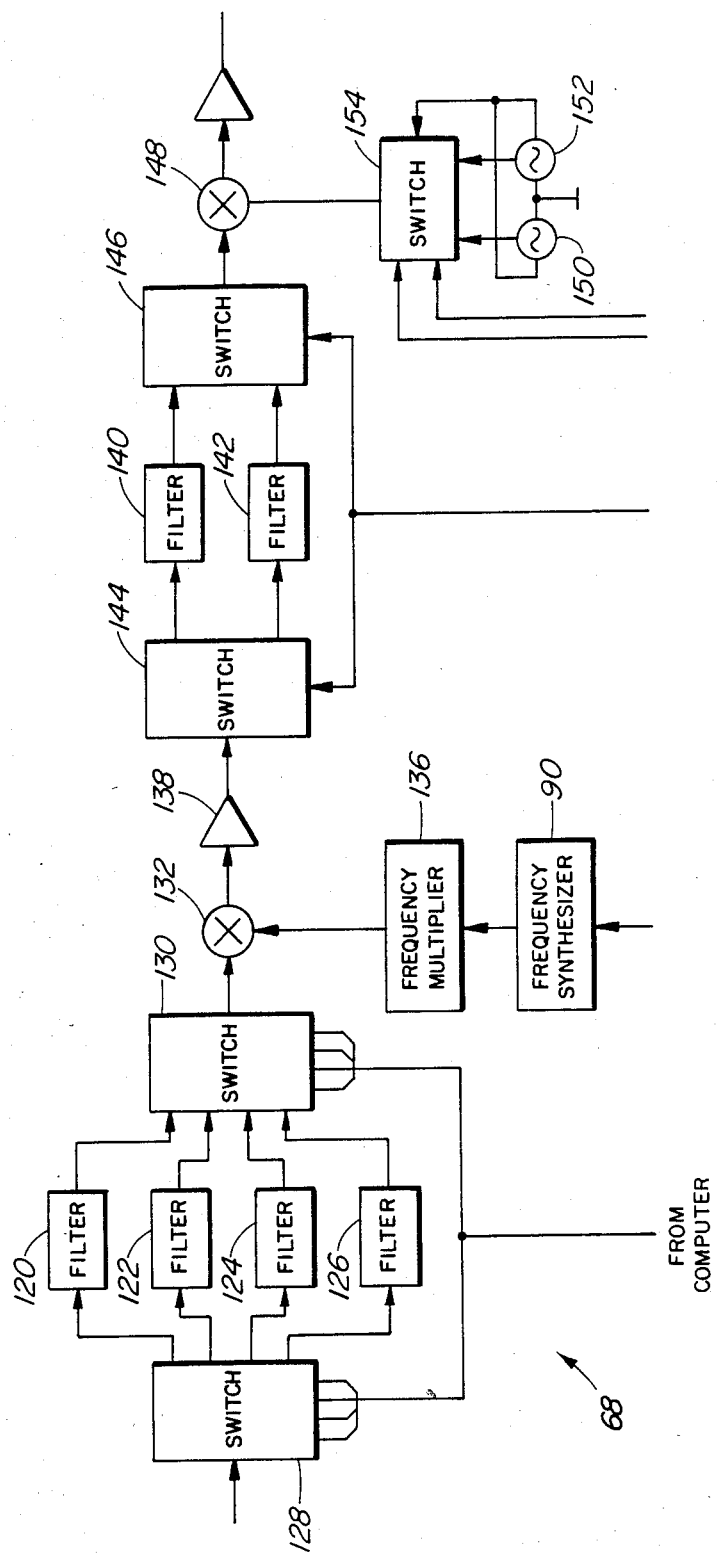
FIG. 8 is a circuit diagram illustrating a portion of the receiver of the apparatus of FIG. 3.

With reference to FIG. 8, RF receiver 68 is provided with four coaxial filters 120, 122, 124 and 126 which preselect the band of operation in order to suppress image response and local oscillator leakage to the antenna port. The four bands of operation are 1–30, 30–90, 90–195 and 195–300 MHz. A pair of high isolation relay type switches 128 and 130 select the appropriate filter under computer control.

A high level double balanced diode type mixer 132 converts the input signal to an IF of either 122 MHz or 70 MHz depending upon the band selected by switches 128 and 130. A local oscillator signal originates in an external frequency synthesizer 90 and is converted up in a multiplier module 136. The multiplier module is required because the chosen frequency plan requires local oscillator signals in the range of 123 to 422 MHz and the synthesizer used operates only to 160 MHz.

An amplifier 138 amplifies the IF signal and passes it through one of a pair of filters 140 and 142 determined by computer controlled switches 144 and 146. These filters suppress RF to IF feed through.

A high level double balanced type mixer 148 is also used to convert the 70/122 MHz IF down to a second IF of 10.7 MHz. The mixer is driven by one of two crystal controlled oscillators 150 and 152 operating at 80.7 and 132.7 MHz, respectively. A computer controlled switch 154 selects the appropriate oscillator.

Figure 9A:
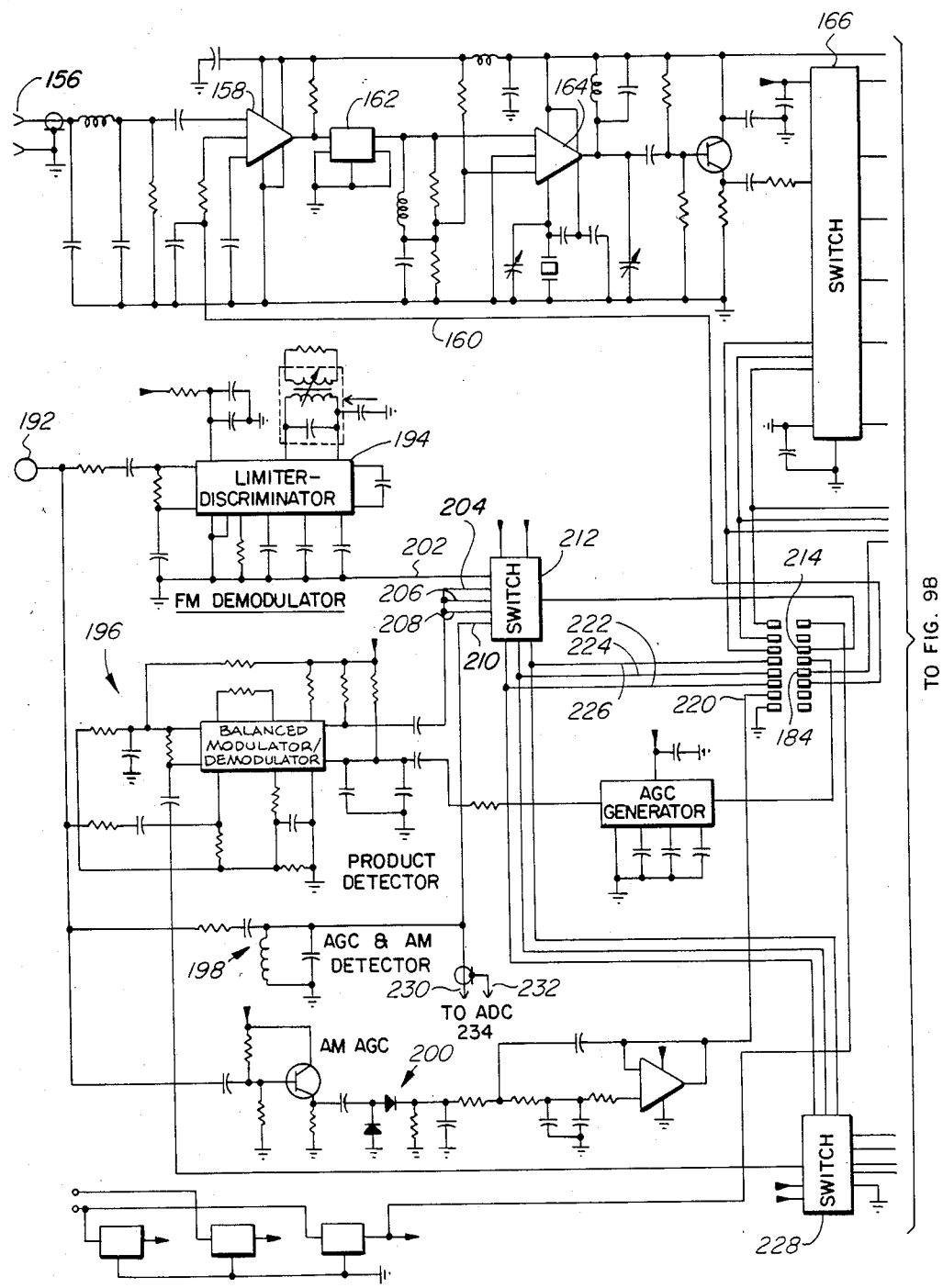
FIGS. 9A and 9B are circuit diagrams illustrating an IF and demodulator module.
Figure 9B:
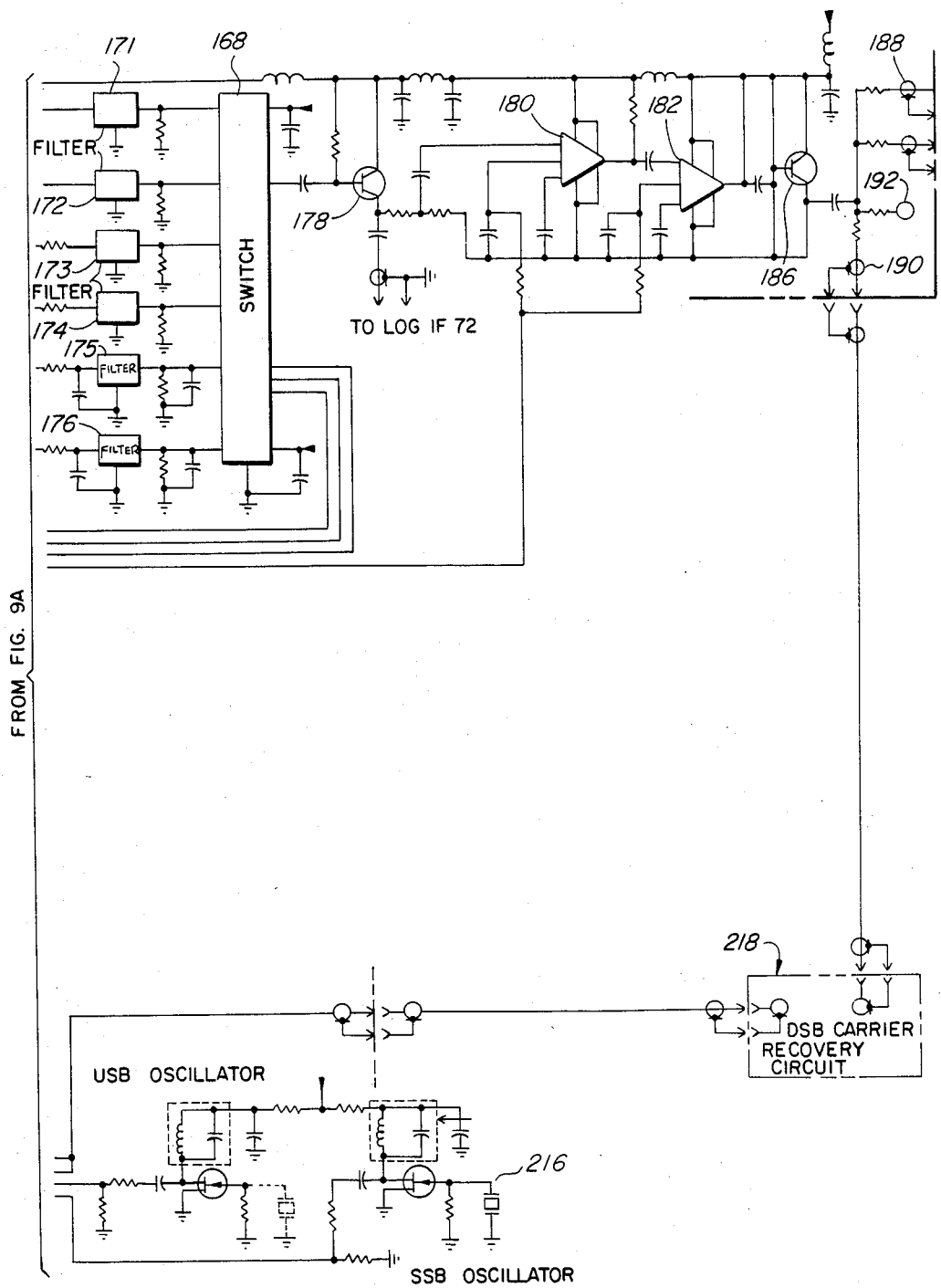

FIG. 9 illustrates the IF module 70. The 10.7 MHz signal output from the receiver is received at 156 and fed to a 10.7 MHz IF amplifier 158, which also receives a gain control signal along line 160 from a gain control circuit, described later, and DAC 96. The signal then passes through a 10.7 MHz band pass filter 162 and into a combined mixer-oscillator stage 164 which converts the 10.7 MHz signal to 455 kHz. A pair of computer controlled analog switches 166 and 168 select one of six filters 171-176 having, respectively, 24, 12, 6, 3 kHz, USB and LSB band pass characteristics. As mentioned previously, at particular IF bandwidths, some APD measurements for some types of modulation are very similar. Accordingly, the provision of six different filters in the IF amplifier provides the means of accurately distinguishing certain modulation types in those situations where the signal identification circuits are unable to identify the modulation type in the first identification attempt.

The output of switch 168 is fed to buffer amplifier 178 which drives a LOG IF amplifier and gain control stages 180 and 182. The gain control signal originates at terminal 184. A further buffer stage 186 drives outputs 188, 190 and 192. Output 188 is the input to the signal identification unit; output 190 is the input to a DSB carrier recovery loop 218 and 192 is the input to the demodulator circuitry.

With reference to FIG. 9A of the drawings, the 455 kHz signal is fed to a conventional limiter-discriminator FM demodulator 194, a SSB/DSB product detector demodulator 196, an AM demodulator 198 and an AM AGC 200. The audio outputs, i.e. the FM, DSB, LSB, USB and AM signals, are respectively connected to terminals 202, 204, 206, 208 and 210 of analog switch 212. The output of switch 212 is connected to a terminal 214 which in turn is connected to an audio amplifier 215 (see FIG. 3).

The 455 kHz BFO for the SSB/DSB product detector demodulator is provided either by a crystal oscillator 216 or the DSB recovery loop 218. The output of the AM AGC is connected to terminal 220. Demodulator module input terminals 222, 224 and 226 are connected to analog switches 212 and 228. The output of the AM detector is also connected to terminals 230 and 232 which, in turn, are connected to an ADC 234 (FIG. 10) via a low pass filter 236.

Figure 10:
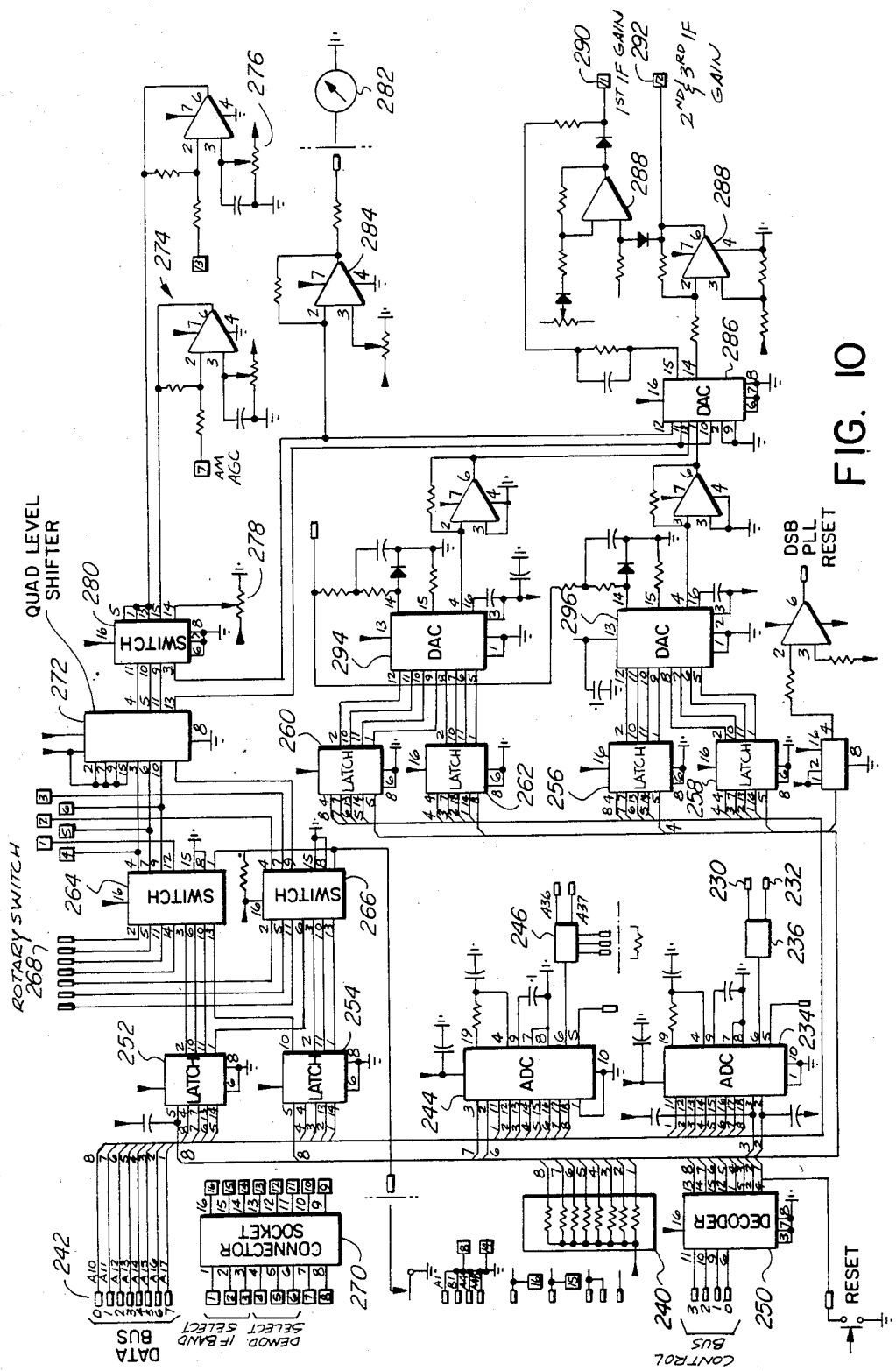
FIG. 10 is a schematic illustrating an IF-computer interface circuit.

FIG. 10 is a schematic view illustrating the interface between the IF module and the computer. This circuit enables the operator to select and control the IF amplifier bandwidth, demodulation and gain. The inputs to this circuit are the IF envelope detector and log IF output signal (from FIG. 3), demodulator select and IF band select signals (at socket 270) and connections from a rotary switch (mounted on the control panel).

The output of ADC 234 is connected to the data bus at 242. Similarly, the LOG IF output is connected to an ADC 244 (ADC 74 in FIG. 3), via low pass filter 246, and output to the data bus at 242. The four LSBs (Least Significant Bits) of the control bus are decoded by IC 250 and control latches 252, 254, 256, 258, 260 and 262. In addition, the IC drives ADCs 234 and 244.

The IF bandwidth and demodulator select data are latched by latches 252 and 254 and their output is connected to switches 264 and 266 which are also connected to rotary switch 268 controlled by the manual mode computer switch. The output of switches 264 and 266 is fed to the IF filter select switches 166 and 168 and demodulator select switches 212 and 228 via socket 270 and a sixteen way ribbon cable (not shown). A quad-level shifter 272 shifts the demodulator select and gain control select data. The gain control sources are AM AGC from circuit 274, AGC from circuit 276 and FM set gain set by resistor 278. These sources are selected by analog switch 280 and output to an S meter 282 via circuit 284 and to the IF amplifiers via DAC 286 and ICs 288. Output 290 is connected to the gain control terminal of the 10.7 MHz amplifier while output 292 is connected to the two gain control stages of the IF circuit (see FIG. 9). Individual control of the IF amplifier gain is achieved by loading data into the DACs 294 and 296 via latches 260, 262, 256 and 258. The DACs convert the computer generated data into analog voltages which control the IF amplifier gain after selection by IC 286.

Figure 11:
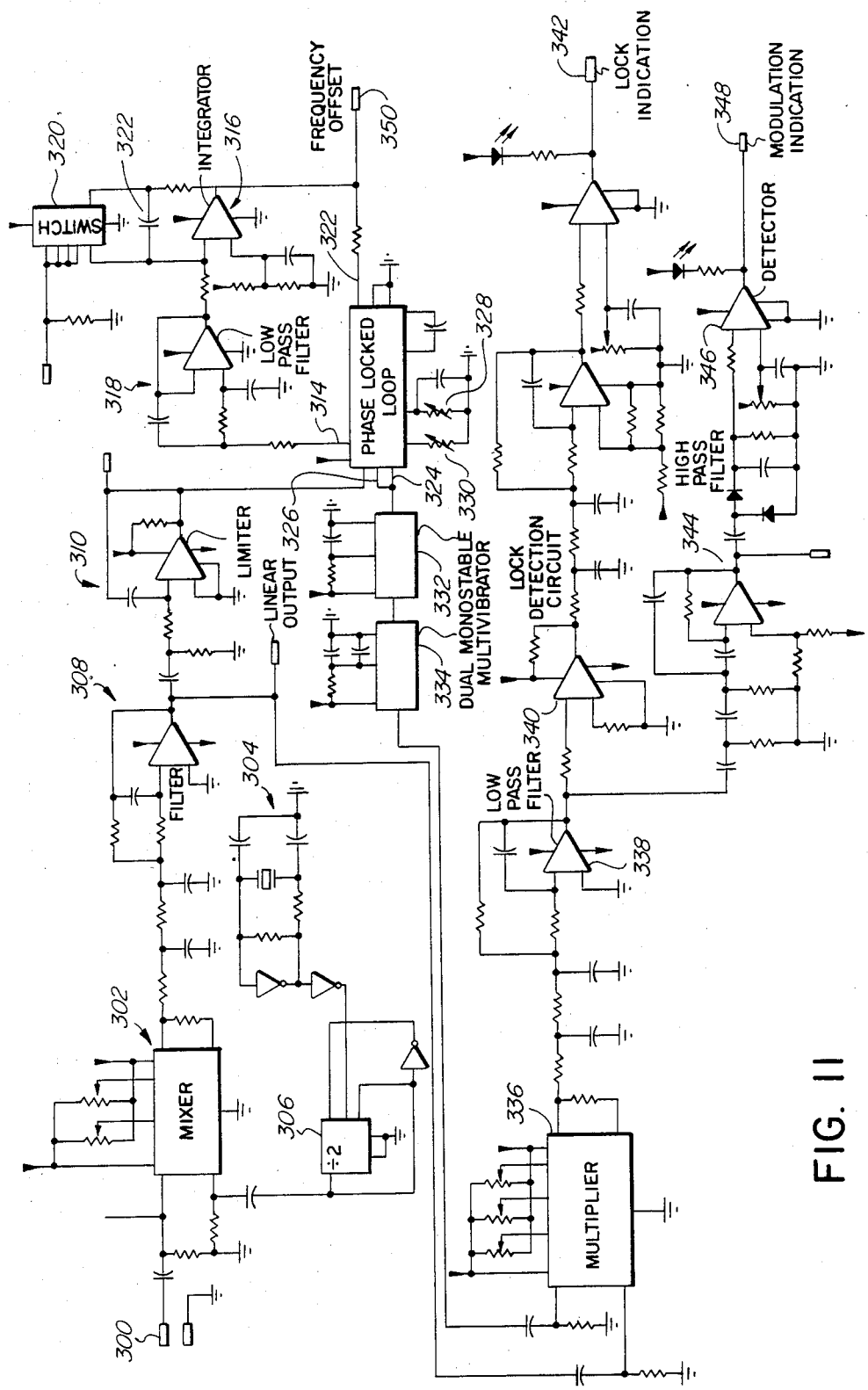
FIG. 11 is an electrical schematic illustrating an AM phase-locked loop.
Figure 12:
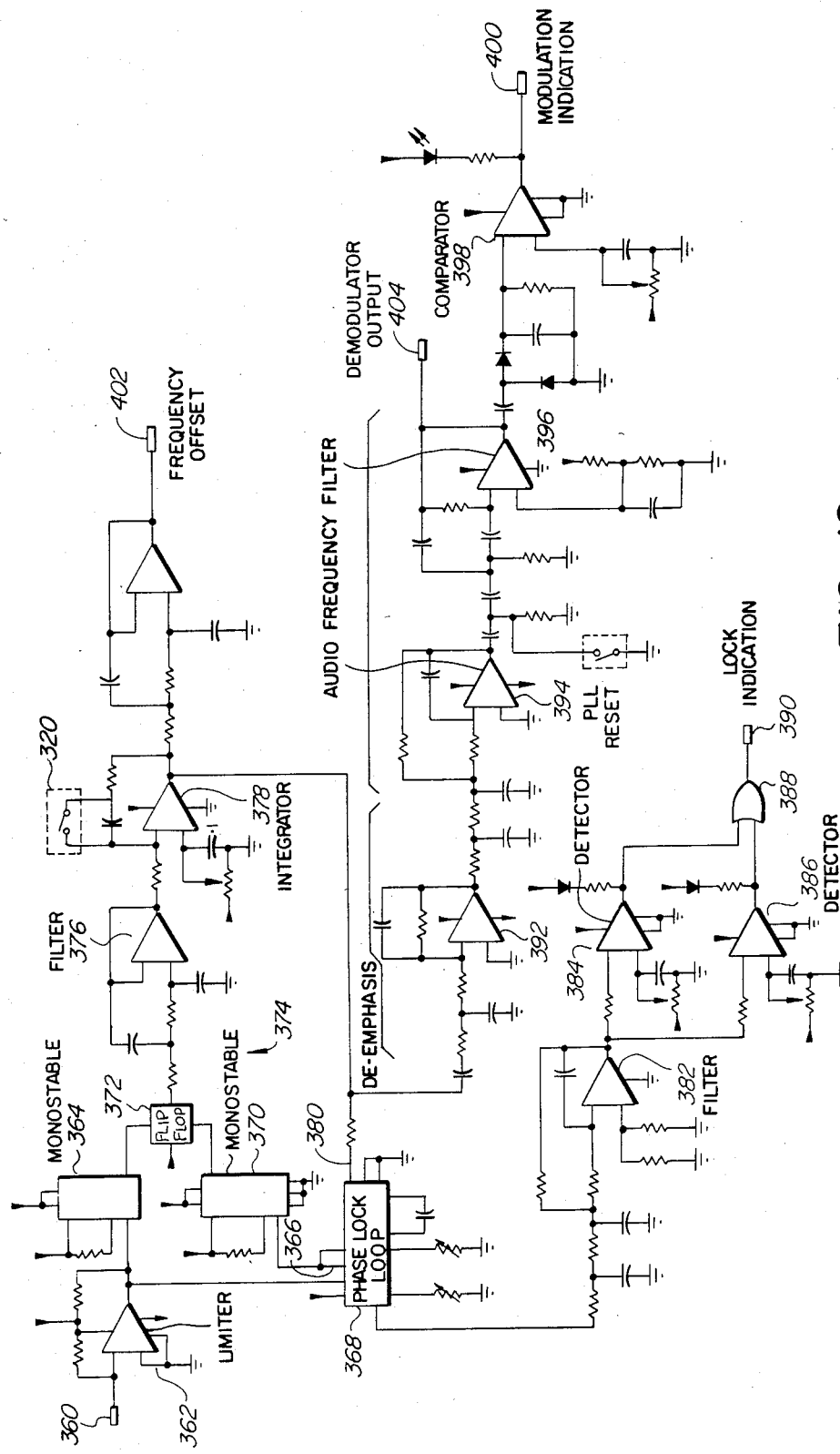
FIG. 12 is an electrical schematic illustrating an FM phase-locked loop.
Figure 13:
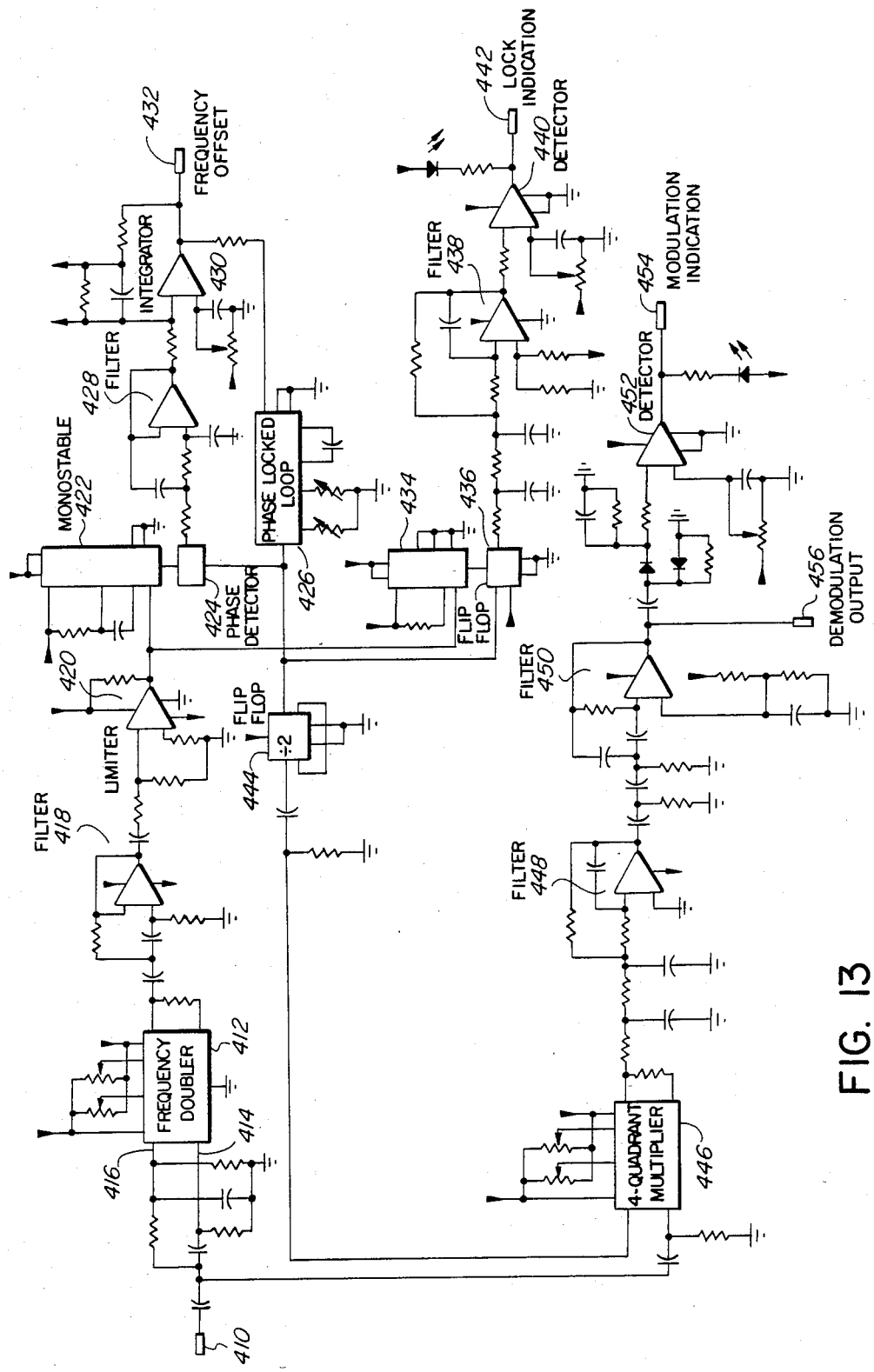
FIG. 13 is an electrical circuit illustrating a DSB phase-locked loop.

The description now turns to the three phase-locked loops with reference to FIGS. 11, 12 and 13.

The AM phase-locked loop is illustrated in FIG. 11. The 455 kHz IF input at terminals 300 is down converted by mixer 302 to a loop input frequency of 45 kHz. A 1 MHz crystal oscillator 304 generates the local oscillator signal and feeds it to mixer 302 after division by 2 in IC 306. The 45 kHz input of mixer 302 is low pass filtered by filter 308 and amplitude limited by limiter 310. This process removes most of the amplitude modulation before the signal, which is now a square wave, is applied to a phase detector in a phase-locked loop integrated circuit 312. The phase detector (PD) is an exclusive OR gate and generates a triangular phase characteristic. The PD output at terminal 314 is fed to a loop integrator 316 via a low pass filter 318. An analog switch 320 is used to reset the integrator capacitor 322 at the start of the signal identification process. This switch also resets the integrators of the two other phase-locked loops.

The integrator output is applied to a VCO in circuit 312 via pin 322 and the VCO output, at pin 324, is fed back to the PD input at pin 326. The VCO center frequency is 45 kHz set by potentiometer 328 and the VCO range is ±20 kHz set by potentiometer 330. The PD inputs are 90° out of phase when the loop is locked. Dual monostable multivibrators 332 and 324 delay and reform a square wave from the VCO output 324 that is 180° out of phase with the input from IF filter 308. These two signals are multiplied together in multiplier 336 which forms a coherent detector. The coherent detector output is low pass filtered by filter 338. The DC level at the output of filter 338 is sensed by a lock detection circuit 340 and output at 342 to provide a "LOCK INDICATION" output. The AC component of filter 338, which is the demodulated AM signal, is separated from the DC component by a high pass filter 344. The demodulated signal is then sensed by detector 346 to provide a "MODULATION INDICATION" output at 348. The output 350 of integrator 316 is the "FREQUENCY OFFSET" signal. Outputs 342, 348 and 350 are interfaced with the computer via a data bus, as previously mentioned.

FIG. 12 illustrates the FM phase-locked loop. The 455 kHz IF input signal at 360 is passed through a limiter 362 to remove any amplitude modulation. Monostable 364 converts this signal to narrow pulses of width of approximately 200 ns. The output 266 of a VCO in a phase-locked loop integrated circuit 368 is treated similarly by monostable 370. The two sets of pulses are used to set and reset flip-flop 372. This forms a phase detector 374. When the loop is locked, pulses at the set and reset pins of the flip-flop are 180° out of phase. The phase detector output is filtered by filter 376 and passed to a loop integrator 378. As previously mentioned, the integrator capacitor is reset at the start of the signal identification by analog switch 320 (FIG. 10). The integrator output is applied to pin 380 of PLL 368. The VCO center frequency is 455 kHz and the range is ±30 kHz. The VCO output is connected to an auxiliary phase detector in PLL 368. The other input to this phase detector is the limited output from limiter 362.

The output from the auxiliary phase detector in PLL 368 is used to generate the "lock" output when the loop is locked. The output of the phase detector is passed through filter 382 and can either be high or low. These states are sensed by detectors 384 and 386 and connected to the input of an OR gate 388 whose output is the "LOCK INDICATION" output at 390.

The "modulation indication" is derived from the VCO tuning voltage, that is, the phase-locked loop is used as an FM demodulator. IC 392 provides de-emphasis and ICs 394 and 396 select only voice frequency components in the range of 300 to 3000 Hz. The filter output of IC 396 is detected and then sensed by comparator 398 to provide the "MODULATION INDICATION" output at 400.

Output 402 of the low pass filtered output of 378 is the "FREQUENCY OFFSET" signal.

A "DEMODULATOR OUTPUT" is obtained at 404.

The four loop outputs are connected to the control bus for input to the computer.

FIG. 13 illustrates the DSB phase-locked loop. The 45 kHz down converted output from the AM phase-locked loop is applied to the DSB loop at 410 and then to a frequency doubler circuit in IC 412. The RC input networks give phase shifts of ±45° and −45° to two multiplier inputs 414 and 416 of IC 412. This reduces the DC component at the output. The 90 kHz signal is filtered by filter 418 and limited by limiter 420 and then input into a monostable 422. The output of the monostable is a square wave which is directed to phase detector 424.

Phase detector 424 is an exclusive OR gate. Its other input is derived from the square wave output from a VCO in a PLL integrated circuit 426. The phase detector output is passed through filter 428 and integrator 430. Integrator 430 is reset at the start of the signal identification process as previously mentioned. The integrator output drives the VCO in PLL 426 and provides an output voltage at 432 which is proportional to the "FREQUENCY OFFSET" when the loop is locked.

The VCO which is part of PLL 426 has a centre frequency of 90 kHz and a range of ±40 KHz.

Since the loop locks at a 90° phase offset, IC 434 is used to provide an additional 90° shift to the input signal before it and the VCO signal are applied to the carrier detect D type flip-flop 436. The flip-flop output is passed through filter 438 and detector 440 and output at 442 as the "LOCK INDICATION" output.

In order to demodulate DSB signals, the carrier must be recovered. This is achieved by dividing the VCO frequency by 2 in a flip-flop 444. The recovered carrier signal at 45 kHz is fed to the product detector in an IC 4-quadrant multiplier 446. The demodulated signal is passed to a 300–3000 Hz high pass-low pass filter 448 and 450. This serves to select only voice frequency components at the product detector output. The demodulated and filtered signal is detected and then sensed by detector 452 to give the "MODULATION INDICATION" output at 454. A "DEMODULATION OUTPUT" is obtained at 456.

The four loop outputs are interfaced with the computer by a control bus as previously mentioned.

In summary, it will be seen that the present invention provides a method and an apparatus which permits rapid scanning of RF bands of interest, display of unknown signal parameters and identification of signal modulation type and actual frequency by relatively untrained and unskilled operators and this overcomes the drawbacks of conventional RF spectrum surveillance methods and devices.

The preceding description and drawings discuss and illustrate only the major components of the invention. Those to whom the specification is addressed will appreciate that there will be additional ancilliary circuits and will know how to design and implement such circuits. Thus, the details of such circuits as well as the details of the filter preselector, the frequency synthesizer and multiplier, the log IF circuit, connections between the computer and these and other components, programming of the computer to carry out its control functions and display functions have been omitted in the interest of brevity and since these details do not in themselves form part of the invention.

The use of a computer in the signal identification circuit and as a receiver control device is believed to be the best mode of carrying out the present invention because of the ease with which the operational parameters can be entered or altered and the result of signal identification can be displayed and stored. However, it is to be understood that the invention is not limited to a computer-based application. Indeed, it is well within current technology and expertise to replace the computer with hard-wired electronic circuitry given the foregoing description. An example of such a circuit is described below with reference to FIG. 14.

Figure 14:
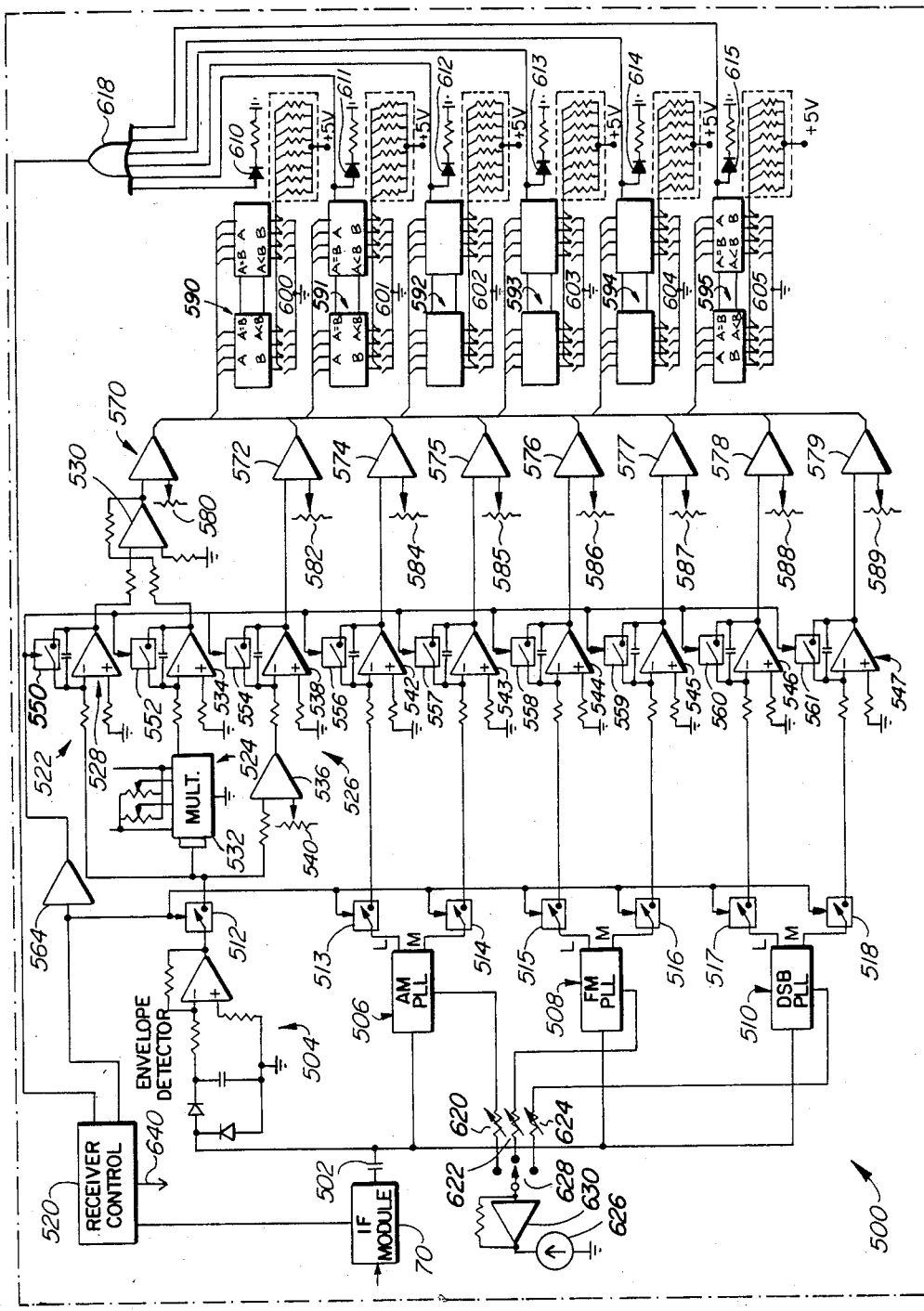
FIG. 14 is a schematic illustrating an electrical circuit for sampling unknown signals, conducting two levels of comparison and indicating the type of modulation and actual frequency of identified signals.

With reference to FIG. 14, the output of aforedescribed IF module 70 is directed, via capacitor 502, to an envelope detector 504, an AM phase-locked loop circuit 506, an FM phase-locked circuit 508 and a DSB phase-locked loop circuit 510. The three phase-locked loop circuits are identical to those illustrated in FIGS. 11–13 and thus each includes a "lock indication" output, L, a "modulation indication" output, M, and an "offset voltage" output.

The output of detector 504 and the L and M outputs of the phase-locked loop circuits 506, 508 and 510 are applied to analog switches 512–518, respectively, controlled by a receiver control circuit generally designated by reference numeral 520.

Switch 512 is connected to three circuits, namely, circuit 522 for calculating the mean of an unknown signal, circuit 524 for calculating the variance of the unknown signal and a circuit 526 for calculating P(0).

Circuit 522 includes an integrator 528 whose output is the mean of its input signal and fed to one input of an operational amplifier (OP-AMP) 530. Circuit 524 includes a multiplier 532 and an integrator 534. Multiplier 532 is an integrated circuit, such as that manufactured under part number AD 533, the output of which is the square of its input. Thus, the output of integrator 534 is the mean square of the unknown signal which is applied to OP-AMP 530. The output of OP-AMP 530 is the variance of the unknown signal.

Circuit 526 includes a comparator 536 and an integrator 538. The unknown signal is applied to one input of comparator 536 while its other input is connected to a potentiometer 540 set at "0". The output of the comparator is connected to integrator 538 whose output is proportional to P(0).

Switches 513–518 are connected to the input of integrators 542–547, respectively, the outputs of which are proportional to the percentage of lock or modulation, whichever is applicable, of the unknown signal.

Each of integrators 528, 534, 538 and 542–547 is of the conventional form of an OP-AMP, such as that manufactured under part number 741, having a capacitor in a feedback loop. Connected in parallel with these capacitors are analog switches 550, 552, 554 and 556–561 which receive control signals from a presettable binary counter 564 controlled by receiver control 520, as will be explained in greater detail later.

It will be recalled that the first comparison step is to compare the variance, P(0), lock and modulation percentage values against predetermined reference values so as to provide a set of logical outputs and that the second comparison step compares this set of logical outputs against a plurality of sets of logical reference values, each of which is representative of a known modulation type.

The first comparison step is achieved by eight comparators 570, 572 and 574–579 respectively connected to the output of OP-AMP 530 and integrators 538 and 542–547 and potentiometers 580, 582 and 584–589. Each potentiometer is set to a value corresponding to the appropriate one of the reference values given in Table II. Thus, the output of each comparator is either a logical "1" or a logical "0".

The second comparison step is achieved by six logic comparators 590–595, such as the dual-in line package 4-bit magnitude comparator manufactured under part number 4585. Each of comparators 590–595 is set to one of the logical reference values given in Table III by switch banks 600–605 and receives the output from each comparator 570, 572 and 574–579, as shown. The outputs of comparators 590–596 are connected to light emitting diodes (LED's) 610–615, respectively, and to a six-input NOR-gate 618. NOR-gate 618 is connected to receiver control circuit 520 as shown.

Thus, when the set of logical values fed to comparators 590–596 by comparators 570, 572 and 574–579 matches the logical reference values of one of the former, the LED associated with that comparator is actuated and a high level signal is applied to NOR-gate 618. In this situation, the remaining outputs from the comparators will be low level signals. In the event that there is no match, the NOR-gate applies a signal to receiver control 520 which, in turn, applies appropriate signals to switches 166 and 168 of the IF module 70 so as to switch in the 6 kHz filter as previously explained.

Before the identification process is initiated, all integrators are zero'd by closure of analog switches 550, 552, 554 and 556–561. At the start of an identification attempt, receiver control 520 applies a start identification pulse to switches 512–518 and counter 564, which pulse closes switches 512–518 and opens switches 550, 552, 554 and 556–561. Thus, the output of detector 504 and the outputs of phase-locked loops 506, 508 and 510 are applied to the signal identification portion of the circuit as previously explained. After a predetermined interval of time, as determined by counter 564, switches 512–518 are opened to terminate sampling. Signal identification takes about half of one second.

Once the signal has been identified or if the signal is not identified after the second identification attempt, receiver control 520 applies a synthesizer control signal, via output terminal 640, to the frequency synthesizer to increment the centre frequency. The process is then repeated.

The offset voltage outputs of the phase-locked loop circuits 506, 508 and 510 are respectively connected to potentiometers 620, 622 and 624 which, in turn, are connected to a suitably calibrated centre zero meter 626 via a switch 628 and an OP-AMP 630. Once the type of modulation of a signal has been identified (when one of the LEDs is turned "on"), switch 628 is actuated to connect the appropriate offset voltage output to the zero meter. The actual frequency of the signal is then readily determined by adding the offset frequency to the receiver frequency.

Other changes and modifications may be made to the invention without departing from the spirit of the appended claims.

TABLE I

| EXPECTED PHASE LOCK LOOP RESULTS A "1" INDICATES LOCK CONDITION A "0" INDICATES NO LOCK CONDITION An "X" IS "1" or "0" | | | | | | |
|---|---|---|---|---|---|---|
| SIGNAL | AM-M | AM-L | FM-M | FM-L | DSB-M | DSB-L |
| AM | 1 | 1 | 0 | 1 | 1 | 1 |
| FM | X | 0 | 1 | 1 | X | 0 |
| PSK | 1 | 0 | 1 | 1 | 1 | 1 |
| CW | 0 | 1 | 0 | 1 | 0 | 1 |
| DSB | X | 0 | 1 | 0 | 1 | 1 |
| SSB | X | 0 | X | 1 | X | 0 |

TABLE II

| REFERENCE VALUES USED FOR SIGNAL IDENTIFICATION | | | | | | | |
|---|---|---|---|---|---|---|---|
| | AM-M | AM-L | FM-M | FM-L | DSB-M | DSB-L | $S^2$ | P(0) |
| REF VALUES | 31.25* | 81.25* | 62.5* | 50.0* | 25.0* | 81.25* | 256 | 0.0039 |

*percentage

TABLE III

| REFERENCE LOGIC TABLE | | | | | | | | |
|---|---|---|---|---|---|---|---|---|
| SIGNAL | AM.M | AM.L | FM.M | FM.L | DSB.M | DSB.L | $S^2$ | P(0) |
| AM | 1 | 1 | 0 | 1 | 1 | 1 | 1 | 0 |
| FM | X | 0 | 1 | 1 | X | 0 | 0 | 0 |
| PSK | 1 | 0 | 1 | 1 | 1 | 1 | 0 | 0 |
| CW | 0 | 1 | 0 | 1 | 0 | 1 | 0 | 0 |
| DSB | X | 0 | 1 | 0 | 1 | 1 | 1 | 1 |
| SSB | X | 0 | X | 1 | X | 0 | 1 | 1 |

The embodiments of the invention in which an exclusive property or privilege is claimed are defined as follows:

1. A spectrum surveillance apparatus for surveilling signals within a predetermined RF band and identifying the type of modulation of signals within said band, said apparatus comprising:
   a receiver adapted to receive RF signals at an adjustable reception frequency within said RF band and convert said RF signals to IF signals having a predetermined IF;

RF filter means for filtering signals input to said receiver, said filter means including a plurality of filters having bandwidths together spanning said RF band;

first switch means for selectively passing said signals through the one of said filters having the bandwidth containing said reception frequency;

IF filter means for filtering the output of said receiver, said filter means having at least one filter having a relatively broad passband and at least one filter having a relatively narrow passband, said broadband filter being normally connected to the output of said receiver and second switch means for switching the output of said receiver from said broadband filter to said narrowband filter;

means for sampling the envelope of said IF signal;

means responsive to said sampling means for providing signals representative of at least the mean, the variance, and the percentage of the samples of said signal which have at least one predetermined amplitude;

a first comparator for comparing each said representative signal with a threshold value and providing a logical set of outputs corresponding to said representative signals;

a second comparator for comparing said set of logical outputs with a plurality of sets of logical reference values, each distinctive of a particular modulation type, and providing a first output indicative of the type of modulation of said signal when said logical set of outputs substantially matches one of said sets of logical reference values or a second output when said set of logical outputs does not match any of said sets of reference values;

means responsive to said second comparator second output for causing said second switch means to switch the output of said receiver from said broadband filter to said narrowband filter; and means for automatically indexing the frequency of reception of said receiver through at least a predetermined, variable band within said RF band at predetermined, variable frequency increments.

2. A method of surveilling signals within a predetermined RF band and identifying the type of modulation of signals within said band, said method comprising:

receiving RF signals within a relatively narrow band immediately adjacent a reception frequency and converting RF signals within said narrowband to IF signals having a predetermined IF;

passing the IF signal through a broadband IF filter;

sampling the envelope of the output of the broadband filter;

determining at least the mean, the variance and the percentage of samples having at least one predetermined amplitude;

comparing the mean, the variance and the said percentage with a set of corresponding threshold values and providing a set of logical results;

comparing the set of logical results with a plurality of sets of logical reference values and providing an indication of the type of modulation of the IF signal when the logical results substantially match one of the sets of logical reference values;

passing the IF signal through a narrowband filter and repeating the sampling, determining and comparing steps when the logical results do not match any of the logical reference values;

repeating the aforementioned steps within a predetermined band within the RF band at predetermined, variable frequency increments while maintaining a narrow bandwidth of reception immediately adjacent the reception frequency.

3. A spectrum surveillance apparatus for surveilling signals within a predetermined RF band and identifying the type of modulation and actual frequency of signals within said band, said apparatus comprising:

a receiver adapted to receive RF signals at a variable reception frequency within said RF band and convert any signal at said frequency to an IF signal having a predetermined IF;

means for sampling said IF signal and providing AM, FM and DSB lock indication outputs, modulation indication outputs and offset frequency outputs;

means responsive to said sampling means for providing output signals representative of the percentage of said samples which were locked and modulated by said sampling means;

comparator means for comparing said output signals against predetermined sets of reference values, each set being distinctive of a particular modulation type, and providing a first output indicative of the type of modulation of said signal when said representative signals substantially match the reference values of said modulation types and a second signal indicative of an unidentified signal when said representative signals do not match any of said reference values; and means responsive to said comparator means for selecting the appropriate one of said sampling means offset frequency outputs and providing an identified signal actual frequency output.

4. An apparatus as defined in claim 3, said comparator means including:

a first comparator for comparing said representative signals with respective threshold reference values and providing a set of logical outputs; and a second comparator for comparing said set of logical outputs against a plurality of sets of logical reference values and providing said comparator means first and second outputs.

5. A spectrum surveillance apparatus for surveilling signals within a predetermined RF band and identifying the type of modulation and actual frequency of signals within said band, said apparatus comprising:

a receiver adapted to receive RF signals at a reception frequency within said RF band and convert any signal at said reception frequency to an IF signal having a predetermined IF;

RF filter means for filtering the input to said receiver, said filter means including a plurality of filters having bandwidths together substantially spanning said RF band;

first switch means for selectively passing said signals through the one of said filters having the bandwidth containing said reception frequency;

IF filter means for filtering the output of said receiver, said filter means including at least one broadband filter and at least one narrowband filter, said broadband filter being normally connected to the output of said receiver;

second switch means for switching the output of said receiver from said broadband filter to said narrowband filter;

an AM phase-locked loop connected to the output of said IF filter means and providing an AM lock indication output, an AM modulation indication output and an AM offset frequency output;

an FM phase-locked loop connected to the output of said IF filter means and providing an FM lock indication output, an FM modulation indication output and an FM offset frequency output;

a DSB phase-locked loop connected to the output of said IF filter means and providing a DSB lock indication output, a DSB modulation indication output and a DSB offset frequency output;

means for sampling the lock and modulation indication outputs of each said loop at a predetermined sampling frequency and providing output signals representative of the percentage of samples which were locked and modulated;

first comparator means for comparing said representative signals with respective threshold reference values and providing a set of logical outputs;

second comparator means for comparing said set of logical outputs against a plurality of sets of logical reference values, each distinctive of a particular type of modulation, and providing a first output indicative of the type of modulation of said signal when said set of logical outputs substantially match one of said sets of logical reference values and a second signal indicative of an unidentified signal when said set of logical outputs does not match any of said sets of logical reference values;

means responsive to said second comparator means second output for causing said second switch means to switch the output of said receiver from said broadband filter to said narrowband filter;

means responsive to said second comparator first output for selecting the appropriate one of said circuit offset frequency outputs and providing an output representative of the actual frequency of said signal; and means for automatically indexing the frequency of reception of said receiver through at least a predetermined variable band within said RF band at predetermined variable frequency increments.

6. A method of surveilling signals within a predetermined RF band and identifying the type of modulation of signals within said band, said method comprising:

receiving RF signals at a reception frequency within said RF band and converting any signal at said frequency to an IF signal having a predetermined IF;

passing said IF signal through AM, FM and DSB phase locked loops having lock and modulation outputs;

sampling the lock and modulation outputs of said phase locked loops;

determining the percentage of samples which indicate lock and the percentage of samples which indicate modulation;

comparing the percentages obtained in the determining step against predetermined sets of reference values, each being distinctive of a particular modulation type; and identifying the type of modulation of the IF signal as being that whose reference values substantially matches one of the predetermined sets of reference values.

7. A spectrum surveillance apparatus for surveilling signals within a predetermined RF band and identifying at least the type of modulation of signals within said band, said apparatus comprising:

a receiver adapted to receive RF signals at a variable reception frequency within said RF band and convert any signal at that frequency to an IF signal having a predetermined IF;

first sampling means for sampling the IF envelope of said IF signal;

second sampling means for sampling said IF signal and providing AM, FM and DSB lock indication and modulation indication outputs;

means responsive to said first and second sampling means for providing signals representative of at least the variance and the percentage of said first sample means samples having at least one predetermined amplitude and signals representative of the percentage of the samples of said second sampling means which are indicative of a condition of lock and modulation;

comparator means for comparing said signals of said responsive means against predetermined sets of reference values, each set being distinctive of a particular modulation type, and providing a first output indicative of the type of modulation of said signal when said responsive means signals substantially match the reference values of said modulation type and a second signal indicative of an unidentified signal when said responsive means signals do not match any of said sets of reference values.

8. An apparatus as defined in claim 7, further including:

means for automatically indexing the frequency of reception of said receiver through at least a predetermined, variable band within said RF band at predetermined, variable frequency increments.

9. A spectrum surveillance apparatus as defined in claim 7, further including:

said second sampling means providing further output signals representative of offset frequencies; and means responsive to said comparator means first output and said second sampling means further output signals for providing an output signal representative of the actual frequency of said signal.

10. An apparatus as defined in claim 7, further including:

filter means for filtering the output of said receiver, said filter means having at least one filter having a relatively broad passband and at least one filter having a relatively narrow passband, and switch means for selectively passing the output of said receiver through one of said filters.

11. An apparatus as defined in claim 7, said second sampling means including:

an AM phase-locked loop circuit means for providing an AM lock indication output, an AM modulation indication output and an AM offset frequency output;

an FM phase-locked loop circuit means for providing an FM ock indication output, an FM modulation indication output and an FM frequency offset output; and a DSB phase-locked loop circuit means for providing a DSB lock indication output, a DSB modulation indication output and a DSB frequency offset output.

12. An apparatus as defined in claim 7, said comparator means including:

a first comparator for comparing said responsive means output signals against predetermined threshold values and providing a set of logical output signals; and a second comparator for comparing each said logical output signals of said first comparator against a plurality of sets of a logical reference values, each set being distinctive of a particular modulation type, and providing said first or second comparator means output.

13. An apparatus as defined in claim 12, said modulation types including AM, FM, DSB, SSB, CW and PSK.

* * * * *

UNITED STATES PATENT AND TRADEMARK OFFICE
CERTIFICATE OF CORRECTION

PATENT NO. : 4,501,020
DATED : February 19, 1985
INVENTOR(S) : Philip E. D. WAKEMAN It is certified that error appears in the above-identified patent and that said Letters Patent are hereby corrected as shown below:

Claim 11, column 20, line 58 the term "ock" should be "lock"

Signed and Sealed this

Seventh Day of May 1985

[SEAL]

Attest:

DONALD J. QUIGG

Attesting Officer    Acting Commissioner of Patents and Trademarks